United States Patent [19]

Lau et al.

[11] Patent Number: 4,533,875
[45] Date of Patent: Aug. 6, 1985

[54] WIDE-BAND GYROTRON TRAVELING-WAVE AMPLIFIER

[76] Inventors: Yue-Ying Lau, 10612 Edgewood Ave., Silver Spring, Md. 20906; Kwo R. Chu, 4916 Andrea Ave., Annandale, Va. 22003; Victor L. Granatstein, 12816 Bluet Lane, Silver Spring, Md. 20906; Larry R. Barnett, 8221 Erika Dr., Manassas, Va. 22111

[21] Appl. No.: 389,133

[22] Filed: Jun. 16, 1982

[51] Int. Cl.³ .......................... H01S 1/00; H01J 23/08
[52] U.S. Cl. ............................................ 330/4; 315/3; 315/5.13; 315/5.35; 330/4.7
[58] Field of Search .................... 315/3, 5.35, 5.13; 330/4.7, 4

[56] References Cited

U.S. PATENT DOCUMENTS

| | | | |
|---|---|---|---|
| 3,271,731 | 9/1966 | Adler et al. | 330/4.7 |
| 3,958,189 | 5/1976 | Sprangle et al. | 330/4.3 |
| 4,224,576 | 9/1980 | Granatstein et al. | 330/4 |
| 4,253,068 | 2/1981 | Barnett | 315/3 |
| 4,370,621 | 1/1983 | Sprangle et al. | 330/4.7 |
| 4,480,234 | 10/1984 | Wachtel | 330/4 |

OTHER PUBLICATIONS

Lau "Collective-Interaction Klystron"; Physical Review Letters, vol. 53, No. 4, 23 Jul. 1984; pp. 395-398.
Maximum Amplification Band of a CRM Twistron by M. A. Molseev vol. 20, No. 8, pp. 1218-1223, Aug. 1977.
NRL Memorandum Report 4346 (Dec. 10, 1980) by Y. Y. Lau and K. R. Chu.
Gyrotron Traveling Wave Amplifier: III by Y. Y. Lau and K. R. Chu; International Journal of Infrared and Millimeter Waves, vol. 2, No. 3, 1981.
Gyrotron Traveling Wave Amplifier: I. Analysis of Oscillations by Y. Y. Lau, K. R. Chu, L. R. Barnett and V. L. Granatstein International Journal of Infrared and Millimeter Waves, vol. 2, No. 3, 1981.

Primary Examiner—S. C. Buczinski
Attorney, Agent, or Firm—Robert F. Beers; William T. Ellis

[57] ABSTRACT

A high power amplifier for amplifying millimeter-wave radiation comprising: a length of metallic waveguide tapered from a small cross-sectional end to a larger cross-sectional end; a magnetron-type electron injection gun for injecting a spiral beam of relativistic electrons at the small end of the waveguide for propagation axially therein so that the wall radius of the tapered waveguide increases in the downstream direction of the electron beam; an input coupler for launching electromagnetic waves to be amplified into the waveguide at the large waveguide end thereof such that the individual frequencies in the input waves are reflected at various points along the constriction of the waveguide taper so that they copropagate with and are amplified by the electron beam; and a magnetic circuit for generating an axial magnetic field within the tapered waveguide with a unique profile approximately in accordance with the following equation to maintain synchronism:

$$\frac{B}{B_o} = \frac{\gamma_{zo}^2 \beta_{\perp o}^2 \lambda_{wo}^2}{2\lambda_w^2}\left[1 + \left(1 + \frac{4\lambda_w^2}{\gamma^2 \gamma_{zo}^2 \beta_{\perp o}^4 \lambda_{wo}^2}\right)^{\frac{1}{2}}\right]$$

where the z subscript is the waveguide axial direction, the ⊥ subscript designates the direction perpendicular to this axial direction, and the o subscript represents those quantities at the entrance point for the electron beam into the waveguide.

This device has been found experimentally to have negligible launching loss and low sensitivity to electron velocity spread.

5 Claims, 12 Drawing Figures

ENLARGED CROSS-SECTIONAL VIEW AT NARROW END (z=0)

MAGNETIC FIELD PROFILE

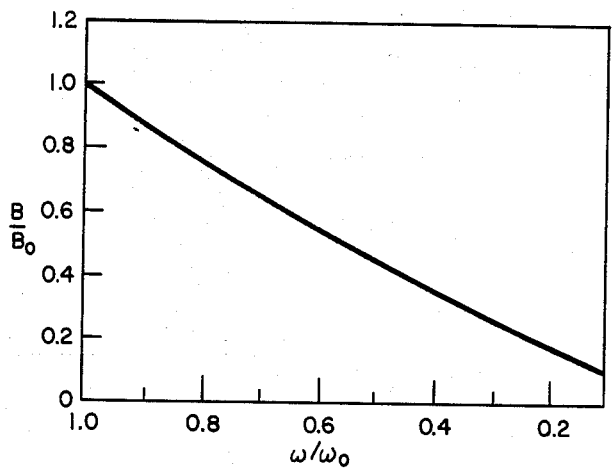
FIG.2
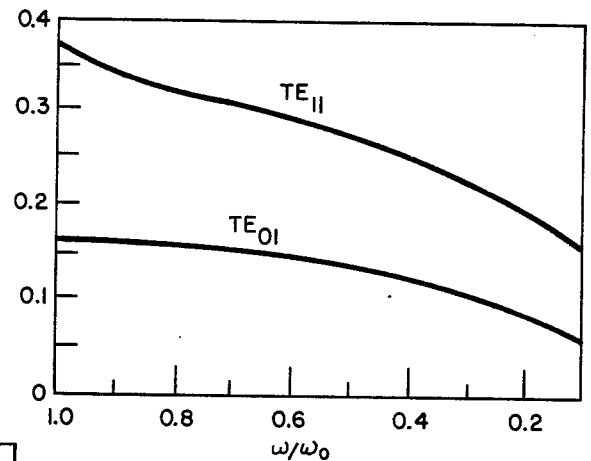
FIG.3
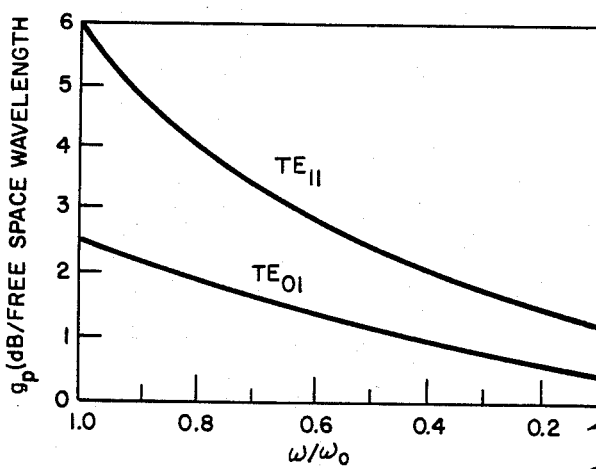
FIG.4
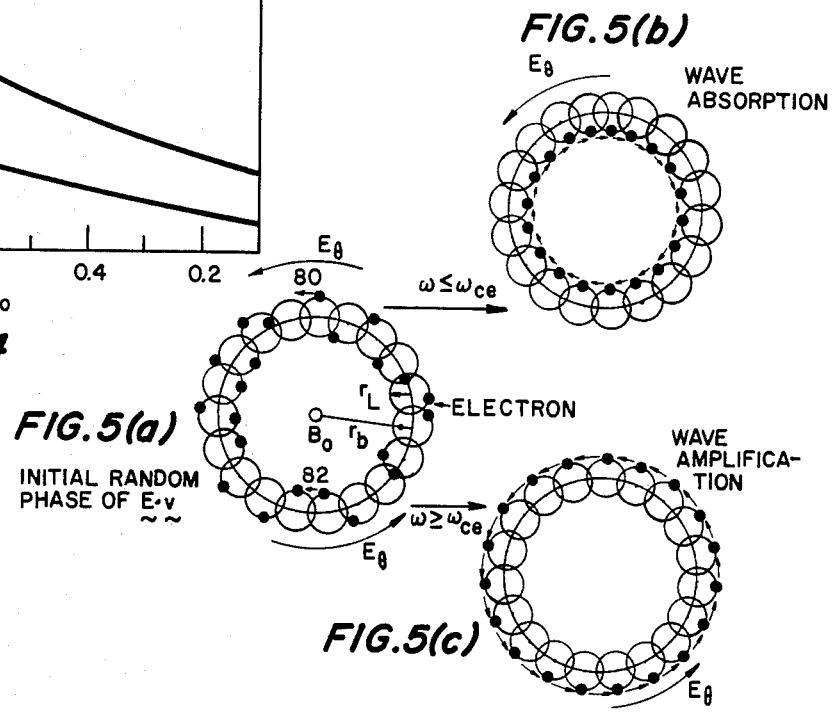
FIG.5(a)
FIG.5(b)
FIG.5(c)

WIDE-BAND GYROTRON TRAVELING-WAVE AMPLIFIER

BACKGROUND OF THE INVENTION

The present invention relates generally to millimeter and submillimeter wave amplifiers and more particularly, to gyrotron traveling-wave amplifiers for wide-band operation at high power levels.

The power levels available from coherent electromagnetic sources at millimeter wavelengths have been revolutionized by the advent of the gyrotron oscillator. However, information carrying systems such as radar and communications require an amplifier mechanism with substantial instantaneous bandwidth rather than simply an oscillation mechanism. Fast wave gyrotron traveling wave amplifiers currently proposed, have demonstrated power levels (34 kw) that are an order of magnitude greater than those available in conventional millimeter wave traveling-wave take amplifiers. However, their bandwidth is severely limited (approximately 1.5% bandwidth). An alternate type of gyrotron amplifier is the slow wave amplifier. However, its performance is severely limited by dielectric breakdowns, by limited heat dissipation capacity, and by degradation in performance due to the velocity spread of the electron beam. It is the intent of the present invention to ameliorate these difficulties.

As a preliminary to the discussion of the preferred embodiment, a general discussion of the operation of a gyrotron will be provided.

The gyrotron is a new type of microwave device employing the electron cyclotrons maser mechanism. It ideally consists of an ensemble of monoenergetic electrons following helical trajectories around the lines of an axial magnetic field inside a fast wave structure such as a metallic tube or waveguide. The physical mechanism responsible for the radiation in the gyrotrons has its origin in a relativistic effect. Initially, the phases of the electrons in their cyclotron orbits are random, but phase bunching (relativistic azimuthal bunching) can occur because of the dependence of the electron cyclotron frequency on the relativistic electron mass ($\Omega_c = eB/vmc$). Those electrons that lose energy to the wave become lighter, rotate faster, and, hence, accumulate phase lead, while those electrons that gain energy from the wave become heavier, rotate slower, and accumulate phase lag. This rotating electron interaction with the wave results in phase bunching such that the electrons radiate coherently and amplify the wave. Energy transfer from the electrons to the wave is optimized when $\omega - k_z v_{zo} - s\Omega_c \cong 0$, where $\omega, k_z, v_{zo}, s$, and $\Omega_c$, are, respectively, the wave frequency, axial wave number, axial electron velocity, cyclotron harmonic number, and electron cyclotron frequency.

In essence, there is an intrinsic preference for relativistic azimuthal phase bunching in the presence of an electromagnetic wave. This bunching yields a different configuration of electrons in a lower energy state. If the incident wave has a frequency slightly larger than $\Omega_c$ or its harmonics, then stimulated emission will occur. Since this bunching mechanism occurs in phase with the electromagnetic wave, the stimulated radiation emission from the bunching is also emitted in phase with the wave, leading to wave amplification. A more detailed discussion of this mechanism may be found in the Preferred Embodiment section of this specification.

The gyrotron stimulated radiation emission occurs near the frequency $\omega = \Omega_c + k_z v_{zo}$. Since $\Omega_c = eB/\gamma mc$, the radiation wavelength is determined primarily by the strength of the applied magnetic field and is not restricted necessarily by the dimensions of a resonant structure. Thus, unlike most other microwave tubes, the internal dimensions of the device may be large compared to the wavelength, and high power handling capability becomes compatible with operation at millimeter and submillimeter wavelengths. However, it can be seen that some form of control of the magnetic field profile along the fast wave structure is critical to the achievement of any type of wide-band operation. In this regard it has been found that even small changes in the magnetic field at various points along the waveguide interaction region have a great impact on both the efficiency and the gain of the device. In view of the sensitivity to the magnetic field profile, precise control thereof becomes imperative for proper wide-band operation.

OBJECTS OF THE INVENTION

Accordingly, it is an object of the present invention to precisely profile the magnetic field along the fast-wave structure in order to maximize the wide-band operation of the gyrotron amplifier.

It is a further object of the present invention to provide a gyrotron traveling-wave amplifier that is capable of amplifying high power millimeter waves over a wide frequency band.

It is yet a further object of the present invention to reduce the sensitivity of the gyrotron traveling-wave amplifier to electron beam velocity spread.

Other objects, advantages, and novel features of the present invention will become apparent from the detailed description of the invention, which follows the summary.

SUMMARY OF THE INVENTION

Briefly, the invention resides in the combination of a tapered gyrotron traveling wave amplifier utilizing a reverse rf injection technique with a tapered axial magnetic field inside the tapered waveguide portion of the amplifier with the magnetic field having a profile approximately in accordance with the following equation:

$$\frac{B}{B_o} = \frac{\gamma_{zo}^2 \beta_{\perp o}^2 \lambda_{wo}^2}{2\lambda_w^2} \left[ 1 + \left( 1 + \frac{4\lambda_w^2}{\gamma^2 \gamma_{zo}^2 \beta_{\perp o}^4 \lambda_{wo}^2} \right)^{\frac{1}{2}} \right]$$

$B_o$ is the axial magnetic field at the small first end
$\gamma = (1 - V_\perp^2/C^2 - V_z^2/C^2)^{-\frac{1}{2}}$
$\gamma_{zo} = (1 - V_{\perp o}^2/C^2 - V_{zo}^2/C^2)^{-\frac{1}{2}}$
$\beta_{\perp o}$ is the electron velocity perpendicular to the magnetic field at the small first end of the waveguide divided by c,
$\lambda_w$ is the cutoff wavelength of said tapered waveguide,
$\lambda_{wo}$ is the cutoff wavelength of the tapered waveguide at the small first end thereof,
$V_\perp$ is the electron velocity perpendicular to the waveguide axis,
$V_{\perp o}$ is the electron velocity perpendicular to the waveguide axis at the small first end of the waveguide;
$V_z$ is the electron velocity parallel to the waveguide axis, $V_{zo}$ is the electron velocity parallel to the waveguide axis at the small first end of the waveguide.

In one embodiment of the present invention, the gyrotron traveling-wave amplifier comprises: a tapered waveguide wherein the cross-section thereof gradually increases from a small first end thereof to a larger second end for propagating electromagnetic energy therein; a device for generating a beam of relativistic electrons with helical electron motion for application to the small first end of the tapered waveguide to propagate in the axial direction therein; a magnetic circuit for generating a tapered magnetic field within the waveguide in a direction approximately parallel to the axis of the waveguide with a profile as set out in the preceding paragraph; and an input coupler for launching an input electromagnetic wave at the larger second end of the waveguide to propagate toward the small first end such that the individual frequencies of input wave are reflected when they reach the point in the waveguide taper where they approximately match the cutoff frequency of the waveguide. These reflected frequencies then copropagate with and are amplified by the electron beam. This amplifier has a high power amplifying capability over a wide bandwidth and has been experimentally determined to have essentially no launching loss and minimal sensitivity to velocity spreading of the beam electrons at millimeter wavelengths.

BRIEF DESCRIPTION OF THE DRAWINGS

FIG. 2 is a graph of the normalized magnetic field versus the normalized input frequency to the waveguide.

FIG. 3 is a graph of the efficiency of the device versus the normalized input frequency to the waveguide.

FIG. 4 is a graph of the peak gain of the device versus the normalized input frequency to the waveguide.

FIG. 5(a) is a representation of the initial random phrase orientation of the electron with respect to an azimuthal electric field of the input wave ($TE_{01}^{\circ}$).

FIG. 5(b) is a representation of the phase bunching when the input frequency $\omega$ is greater than or equal to the frequency separation between energy levels $\Omega_{ce}$.

FIG. 5(c) is a representation of the electron bunching in their cyclotron orbits when the input wave frequency $\omega$ is less than or equal to the frequency difference between the energy levels of the electrons so that absorption of wave energy is favored.

DETAILED DESCRIPTION OF THE PREFERRED EMBODIMENT

Figure 1A:
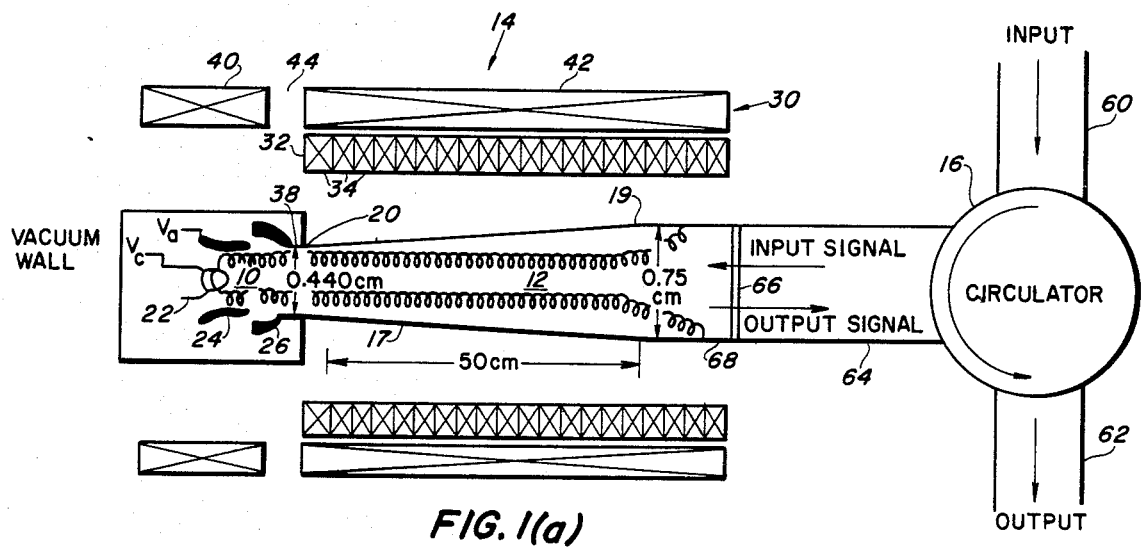
FIG. 1(a) is a cutaway sectional view of one embodiment of the present invention utilizing the $TE_{11}^{\circ}$ mode and operating over a frequency range from 28 GHz to 40 GHz.

Referring now to the drawings, wherein like reference characters designate like or corresponding parts throughout the views, FIG. 1 shows a traveling-wave cyclotron-maser-amplifier structure for amplifying millimeter and submillimeter waves over a wide frequency band. The structure comprises an electron gun 10 for generating a beam of electrons to propagate in a tapered waveguide 12. The wall radius of the waveguide 12 increases in the downstream direction of the electron beam. The waveguide 12, or the entire system including the electron gun 10 may be disposed inside a magnetic circuit 14 for generating a magnetic field within the waveguide 12. An input coupler 16 is disposed upstream from the electron beam entrance point beyond the wide or large cross section opening 19 for the waveguide 12. In operation, the input coupler 16 directs electromagnetic energy to propagate upstream toward the narrow or tapered end 20 of the waveguide 12 at the same time that an electron beam is injected at the small end 20 to propagate axially in the waveguide 12 in the opposite direction. This input wave will be reflected at various points (where the individual frequencies in the wave match the cutoff frequency of the waveguide) along the constriction or tapering of the waveguide 12 such that it co-propagates with the electron beam. When the magnetic field generated by the magnetic circuit 14 is properly profiled relative to the waveguide 12, wide-band amplification will be obtained.

The present amplification mechanism is based on relativisitic azimuthal bunching of the electrons as they co-propagate with the input waves in the waveguide 12. In order to obtain this aximuthal bunching the electrons must be given significant energy in the transverse direction, i.e. cyclotron motion. This cyclotron motion is accomplished by causing the electrons from a beam to follow a helical trajectory around the lines of the axial magnetic field inside the waveguide 12. The generation of a beam of electrons with helical trajectories may be accomplished by a variety of techniques. For examples, a pencil beam of electrons could be generated such that the beam is injected into the magnetic field off axis in relation to the axial magnetic field in the waveguide. The radial magnetic field component at the entrance then causes the electrons to spiral. In the alternative, a Pierce gun with tilled injection or with a transverse electrostatic kicker could be utilized.

A more conventional way of generating a spiral or helical trajectory for the electrons is to use a magnetron injection gun. In FIG. 1, a magnetron injection type gun is utilized for the electron beam generator 10. The magnetron injection electron gun comprises a thermionic cathode 22, an intermediate beam-forming electrode 24, and an anode 26 whose contours and voltages are chosen together with the contour of the magnetic field from the magnetic circuit 14 to produce and propagate an annular electron beam with large energy tranverse to the axis of the gun. The electrons in this beam gyrate at a cyclotron frequency in orbits around the lines of magnetic force. An enlarged cross-sectional view of the small first end 20 of the waveguide is shown in FIG. 1(b) to illustrate the electron cyclotron gyration. The beam velocity ration $\alpha$ of the electrons, that is, the ratio of the transverse electron velocity $V_\perp$, to the axial electron velocity $V_z$, is preferable in the range of $1 < \alpha < 2$, although the device can operate at values of $\alpha$ above or below this range. The electron gun 10 is connected to a modulator which supplies the required operating voltages and currents in the well known manner. It should be noted that the gyrotron design of the present invention can tolerate a large velocity spread. Thus, a wide variety of electron guns can be utilized with the invention.

The magnetic circuit 14 for generating the axial magnetic field may assume a variety of configurations. For convenience, the magnetic circuit 14 in FIG. 1 is supplied by two separate magnetic circuits 30 and 32. Magnetic circuit 30 is a solenoid for generating one or more constant magnetic fields along the length of the structure including the electron gun and the waveguide 12. The magnetic circuit 32 is a trim circuit for tapering the axial magnetic field in the tapered region of the waveguide 12. By way of example, the magnetic circuit 30 may be comprised of a super-conducting solenoid surrounding the e-gun and waveguide 12 structure, i.e. the e-gun and waveguide are disposed in the bore of the solenoid 30.

The solenoid 30 in the present design is composed of two superconducting windings 40 and 42 with a space 44 therebetween. The winding 40 is disposed coaxial with the magnetron gun 10 in order to provide the cathode magnetic field 50 shown in FIG. 1(c). The cathode magnetic field 50 in this case is approximately constant. The winding 42 is disposed coaxial with the tapered waveguide 12. In the present instance, an approximately constant magnetic field 52, represented by the dashed line in FIG. 1(c), is utilized. The resultant of this constant magnetic field 50 and the trim magnetic field (to be discussed below) yields a desired magnetic field profile within the tapered waveguide 12. The space 44 between the windings 40 and 42 permits the rapid rise 54 of the magnetic field from the level 50 to the level 52 to form a compression magnetic field (to be discussed later).

A Dewar structure may be utilized to maintain the proper temperature and pressure for super-conducting operation. This Dewar structure (not shown) may be disposed coaxially around the bore and the super-conducting solenoid 30. Liquid helium within the Dewar structure surrounds and cools the solenoid 30. The Dewar structure generally will be made of a material, such as non-magnetic stainless steel, which is suitable for the configuration herein described.

The trim magnetic 32 is realized in FIG. 1 by a long stack of solenoids 34 disposed to surround and be coaxial with the tapered waveguide 12. In the present configuration, a total of 20 solenoids was utilized. Each solenoid may then be individually wound to tune the field to the desired tapered value. In the alternative, each solenoid 34 may be provided with its own power supply which may be operated to energize each solenoid at the proper current to yield the desired magnetic field taper. Using either alternative, each trim solenoid 34 may be individually tuned to realize the desired magnetic field. In the device actually built, each trim solenoid comprised a water cooled coil of No. 24 guage wire, 2 inch outer diameter ½ inch thick, and 1 inch long.

As noted above, the solenoid 40 provides a magnetic field 50 in the region of the electron gun 10. (See FIG. 1(c).) The compression region 54 of magnetic field following this constant field 50 comprises a radial component of magnetic field $B_{rg}$, and an axial component $B_{zg}$. As the annular electron beam is emitted at relativisitc speeds from the thermionic cathode 22 towards the intermediate electrode 24, the radial component $B_{rg}$ and the axial component $B_{zg}$ of the magnetic field cause the electrons to form cyclotron orbits transverse to the axis of the device. The compression region of the magnetic field compresses the beam to provide an inward velocity component and thus to form the electron velocity ratio $\alpha$ as the beam propagates through the anode 26 and into a drift tube 38.

The waveguide 12 comprises a wall 17 which is tapered from a small end 20 to a larger end 19. The rationale behind this tapering of the waveguide is that there is a minimum frequency which will propagate in a waveguide of constant cross-section. This minimum frequency or cutoff frequency will change as the cross-section of the waveguide changes. When input waves propagate into a portion of the waveguide where those frequencies are less than the minimum frequency (their wavelength is greater than the maximum wavelength which will propagate at that point in the waveguide) than these input means will be reflected back along the waveguide. By tapering the waveguide, i.e. gradually changing the cross-section thereof, the minimum frequency or cutoff frequency for the waveguide will change. Thus, waves of different frequencies will be reflected from different points along the waveguide structure. Accordingly, an input wave composed of a plurality of frequencies propagating from the input coupler 16 toward the small end 20 of the waveguide will have its different frequencies reflected at different points along the waveguide 12 as those frequencies reach the various points in the waveguide where they are equal to the waveguide minimum or cutoff frequency. These reflected waves will then co-propagate with the helically moving electron beams and will be amplified thereby. The use of the tapered waveguide thus permits a plurality of frequencies to be reflected and to copropagate with the electron beam thereby permitting wide-band operation.

The waveguide 12 may take a variety of cross-sectional shapes such as oval, circular, rectangular, square, etc. For convenience, the waveguide 12 actually may be circular in cross-section as depicted in the drawings. The waveguide walls 17 and the drift tube 38 maybe fabricated from standard waveguide material. The region within the drift tube 38 is evacuated to a vaccum of about $10^{-8}$ Torr which is standard for microwave tubes.

The coupler 16 may conveniently be a circulator. The circulator has the advantage that it will separate the input and output waves at the large end of the waveguide. In practice, an input feed waveguide 60 is connected at one side of the circulator. Typically, this feed waveguide 60 will be connected to a source of coherent electromagnetic radiation, such as a microwave oscillator. An output waveguide 62 is connected to the other side of the circulator. If the mode to be amplified in the waveguide 12 is different from the mode in the circulator, a mode converter (not shown) may be utilized in the section 64 between the circulator and the waveguide 12. A window 66 is disposed in the waveguide after the tapered portion to maintain a vacuum in the tapered interaction region. After amplification in the tapered region, the electron beam exits from the tapered metallic waveguide 12 and is guided radially outward by divergent magnetic field lines onto a wall section 68 disposed immediately after the large second end 19 of the tapered waveguide 12. This wall section acts as an electron collector. The magnetic field in this region is designated as 56 in FIG. 1(c).

The electron beam-wave interaction in the present device is the result of the electron cyclotron maser instability. The amplification process obtained from this maser instability can be described both quantum mechanically and classically. Under the quantum mechanical description, two conditions must be satisfied for wave amplification, namely $$2F/2W > 0 \quad (1)$$

and $$2Q/2W < 0 \quad (2)$$

where W is electron kinetic energy, f(W) is the electron distribution function, and Q(W) is the transition probability for stimulated emission. Equation (1) is the familiar requirement for population inversion, and is achieved in electron cyclotron masers by constructing an electron gun that produces a beam of electrons whose transverse energy is sharply peaked around some nonzero value.

The condition in (2) is also realized in electron cyclotron masers since the spacing between quantized energy levels decreases with increasing energy. Solution of the relativistic Schroedinger equation gives the following expression for the electron kinetic energy levels $$W_q = mc^2[1 + 2(q + \tfrac{1}{2}) \ \Omega_o/mc^2]^{\frac{1}{2}} - mc^2 \quad (3)$$

where $q = 1, 2, 3, \ldots$; spin has been neglected; and the nonrelativistic electron cyclotron frequency $\Omega_o = eB_o/m$. It is easily shown that (3) is equivalent to $$W_q = (q + \tfrac{1}{2})\hbar \ \Omega_2/(1 + \gamma(q)) \quad (4)$$

where the relativistic energy factor $\gamma(q) = (W_q + mc^2)/mc^2$. The form of (4) makes clear that relativistic effects serve to decrease the spacing between energy levels as energy increases. In the limit of very large q, where all electron cyclotron masers have operated, the spacing between energy levels becomes $\hbar \Omega_c$ where $\Omega_c = \Omega_o/\gamma$ is the relativistic electron cyclotron frequency. Incident radiation with frequency slightly larger than $\omega_{ce}$ or its harmonics (i.e., $\omega \gtrsim s\Omega_c$; $s = 1, 2, 3, \ldots$) will favor stimulated emission, while $\omega \lesssim s\Omega_c$ will favor absorption.

The classical description of the electron cyclotron maser is closely analogous to the quantum mechanical description. In its high-power embodiment, the electron cyclotron maser contains an annular beam of electrons that propagates down a drift tube guided by an axial magnetic field $B_o$. Each of the electrons has large transverse energy, usually larger than the streaming energy, and so follows a helical path about the magnetic field lines. The Larmor radius $r_L$ is usually much smaller than the radius of the annular beam $r_b$ so that in cross section the beam appears as in FIG. 5(a).

Wave amplification is attributable to phase bunching of the electrons in their cyclotron orbits. In FIG. 5(a), the electrons are shown as their interaction with an electromagnetic wave begins. The electrons have almost a single value of transverse energy but are randomly distributed in phase. A wave with an azimuthal electric field will decelerate electron 80 and accelerate electron 82. Thus, initially some electrons lose energy while others gain energy depending on the initial phase of $v \cdot E$, and there is no net wave amplification. However, the cyclotron frequency, $\Omega_c = eB_o/m\gamma C$ is a function of energy. For electron 80 which is decelerated, $\gamma$ decreases, $\Omega_c$ increases, and the electron will advance in phase in its cyclotron orbit. Similarly, electron 82 will slip back in phase. The resulting phase bunching will favor wave damping if the wave frequency is slightly smaller than the cyclotron frequency or its harmonics in the reference frame where axial electron energy vanishes ($\omega'' \lesssim \Omega_c$); this is depicted in FIG. 5(b).

On the other hand, if $\omega'' \gtrsim \Omega_c$, wave amplification is favored as shown in FIG. 1(c). All the electrons are decelerated and lose energy to the wave. Half a cyclotron period later, the net azimuthal motion of the electrons has reversed, but since the phase of the wave also reverses in approximately half a cyclotron period, the wave continues to decelerate the electrons and extract energy. This synchronism between the orbiting electrons and the field implies that in the laboratory frame, the frequency of the wave is approximately equal to the Doppler shifted-cyclotron frequency (viz., $\omega \simeq \omega_{ce} + k_z v_z$). Wave amplification is maximized when, in addition, the group velocity equals the axial electron velocity (viz., $\partial \omega / \partial K_z = v_1$).

In order to maximum gain and efficiency, it is desired to operate near the cutoff frequency of the waveguide. This cutoff frequency operation can be obtained by selecting the magnetic field such that the waveguide characteristic curve $$\Omega^2 - k_z^2 c^2 - k_{mn}^2 c^2 = 0 \quad (5)$$

and the beam characteristic curve $$\Omega - k_z v_z - s\omega c = 0 \quad (6)$$

barely touch at what is referred to as the grazing point. In the equations (5) and (6)

$k_{mn} = x_{mn}/r_w$, $x_{mn}$ is the nth non-vanishing root of $J'_m(x) = 0$, $\Omega_c = eB/vmc$ $v = (1 - V_\perp^2/c^2 - V_z^2/c^2)^{-\frac{1}{2}}$ s = cyclotron harmonic number.

Figure 6:
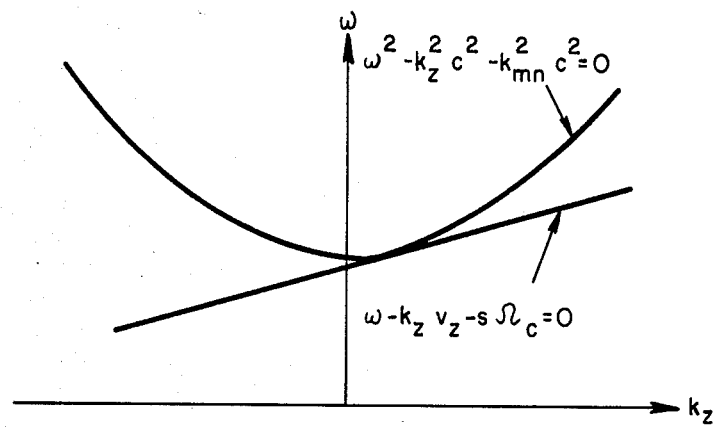
FIG. 6 is a representation of the waveguide characteristic curve intersection with the beam characteristic curve on an $\omega - k_z$ graph.

The waveguide characteristic curve and the beam characteristic curve are shown intersecting at the grazing point in FIG. 6. It is at this grazing point that the wave number and the frequency are the same for both the waveguide and the beam. Thus, the beam and the waveguide are synchronized with each other and their interaction is the strongest. In essence, this means that the group velocity $k_z c^2/\omega$ of the waveguide mode is nearly equal to the velocity $v_z$ of the electron beam. In order to achieve this grazing point intersection at each axial point along the tapered waveguide, it is required to provide a unique magnetic field profile for the magnetic field within the waveguide 12. The equation for this profile is as follows $$\frac{B}{B_o} = \frac{\gamma_{zo}^2 \beta_{\perp o}^2 \lambda_{wo}^2}{2\lambda_w^2}\left[1 + \left(1 + \frac{4\lambda_w^2}{\gamma^2 \gamma_{zo}^2 \beta_{\perp o}^4 \lambda_{wo}^2}\right)^{\frac{1}{2}}\right] \quad (7)$$

where $B_o$ is the magnetic field at the small first end of the waveguide $\gamma = (1 - V_\perp^2/c^2 - V_z^2/c^2)^{-\frac{1}{2}}$ $\gamma_{zo} = (1 - V_{\perp o}^2/c^2 - V_{zo}^2/c^2)^{-\frac{1}{2}}$ $\beta_{\perp o}$ = electron velocity perpendicular to the magnetic field at the small first end or electron entrance of the waveguide divided by c.

$\lambda_w$ is the cutoff wavelength of the tapered waveguide, $\lambda_{wo}$ is the cutoff wavelength of the tapered waveguide at the small first end thereof, $V_\perp$ is the electron velocity perpendicular to the waveguide axis, $V_z$ is the electron velocity parallel to the waveguide axis, $V_{zo}$ is the electron velocity parallel to the waveguide axis at the small first end of the waveguide, $V_{\perp o}$ is the electron velocity perpendicular to the waveguide axis at the small first end of the waveguide.

In addition to the maximum interaction obtained between the wave and the electron beam, the maintenance of the grazing intersection has two additional advantages. First, it corresponds to a small wave number ($k_z$) and, therefore, mitigates the effect of beam velocity spread. Secondly, the beam curve equation (6) will not intersect the waveguide curve equation (5) on the negative $k_z$ axis and, therefore, the backward $TE_{mn}$ mode will not be excited.

Equation 7 is based on the assumption that the cutoff wavelength $\lambda_w$ of the waveguide and the amplitude of the applied magnetic field vary slowly along the axis so that each interaction section is characterized by a distinct frequency. Other assumptions utilized generally in the anaylsis include (i) that the total length L of the waveguide is much longer than the interaction length $\Delta L$ defined as the length over which the cyclotron maser interaction takes place for a fixed input wave frequency; and that all of the electrons have the same perpendicular velocity $V_\perp$ and axis velocity $V_z$ as they enter the waveguide. The precise derivation for equation 7 is discussed in the article "Theory of a Wide-Band Distributed Gyrotron Traveling-Wave Amplifier" by K. R. Chu, Y. Y. Lau, L. R. Barnett, and V. L. Granatstein, IEEE Transactions on Electrons Devices Vol. ED-28, No. 7, July 1981, which article is hereby incorporated by reference into this specification.

Equation (7) is written for a general tapered waveguide configuration. A variety of waveguide configurations may be utilized to implement the tapered waveguide used herein. If, for example, a circular waveguide configuration is utilized, then since the radius $r_w$ of the tapered waveguide is proportional to $\lambda_w$, and $r_{wo}$, the radius at the small end of the waveguide is proportional to $\lambda_{wo}$, and since $r_{wo}/r_w$ is equivalent to $\lambda_{wo}/\lambda_w$, the terms $r_w$ and $r_{wo}$ may be simply substituted for $\lambda_w$ and $\lambda_{wo}$, respectively. Likewise, if a rectangular tapered waveguide configuration is used, the rectangular width $d_w$ may be substituted for $\lambda_w$ and the rectangular width $d_{wo}$ at the small end of the waveguide may be substituted for $\lambda_{wo}$ in equation (7) using the same rationale, i.e., that $d_{wo}/d_w$ is equivalent to $\lambda_{wo}/\lambda_w$.

FIGS. 2-4 provide examples of the dependence of the efficiency $\eta$, the peak gain $g_p$, and the magnetic field B on the input frequency $\omega$ over several octave bands for the $TE_{11}°$ and $TE_{o1}°$ modes interacting with the beam at the fundamental of the electron cyclotron frequency.

The electron beam energy for these calculations was 70 KeV with $V_{\perp o}/V_{zo} = 1.5$. All quantities in these figures, except for $\eta$, are normalized to their respective values at $z = 0$, the entrance point for the electron beam. The initial beam guiding center positions and Larmor radii are: $r_{go}/r_{wo} = 0.7$, $r_{Lo}/r_{wo} = 0.11$ for the $TE_{o1}°$ mode. It is seen from FIG. 3 that the saturation bandwidth (defined as the interval of frequency between points with half of the peak efficiency) of more than two octaves is theoretically possible.

In the actual experiment carried out as described in detail in the paper "An Experimental Gyrotron Traveling Wave Amplifier" by L. R. Barnett, Y. Y. Lau, L. R. Chu, and V. L. Granatstein, a circular waveguide was utilized with a small first opening having a radius r = 0.457 centimeters, and with a large second opening with a radius r = 0.620 cm. The waveguide 12 had a linear tape over a length of 33 cm. The configuration was similar to that shown in FIG. 1 except that the gun 10 was slightly different and the trim magnetic circuit 32 comprised a single solenoid with its windings appropriately varied in accordance with the taper of the waveguide as previously described. The following parameters describe the experiment and the measured result:

center frequency f = 35 GHz
mode = $TE_{01}°$
beam voltage V = 70 KeV
beam current I = 1.0 amps.
center magnetic field B = 13.4 KG
center waveguide radius $\gamma_w$ = 0.54 cm.
average gain $G_p$ = 18 dB
Bandwidth $\Delta F/f$ = 13% (uniform gain).
beam velocity spread = 20%

Figure 7:
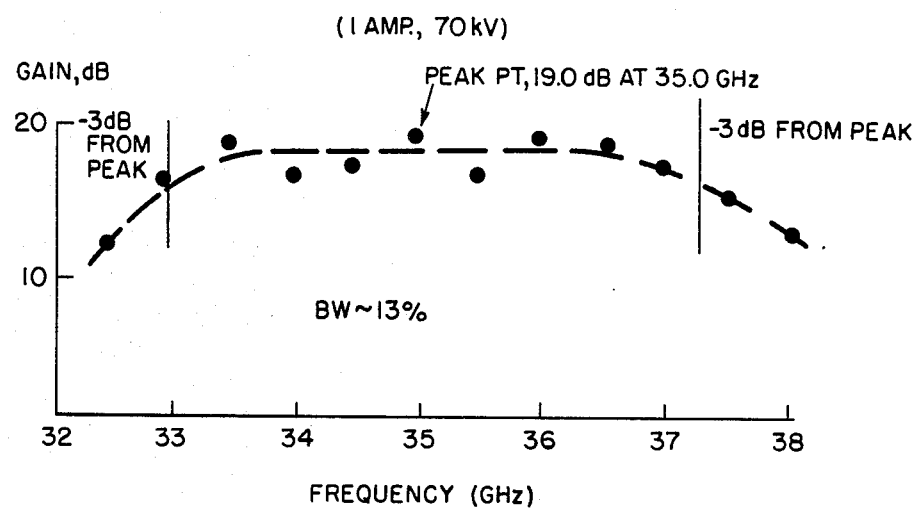
FIG. 7 is a graph of the gain vs frequency response of the experiment which used the $TE_{01}^{\circ}$ mode.

The $TE_{01}°$ waveguide mode and the fundamental beam cyclotron harmonic were utilized in the experiment. A graph showing the measured gain for the device is shown in FIG. 7.

Figure 1B:
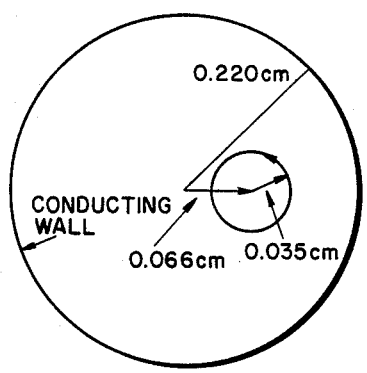
FIG. 1(b) is an enlarged cross-sectional view of the waveguide at z=o in FIG. 1(a).
Figure 1C:
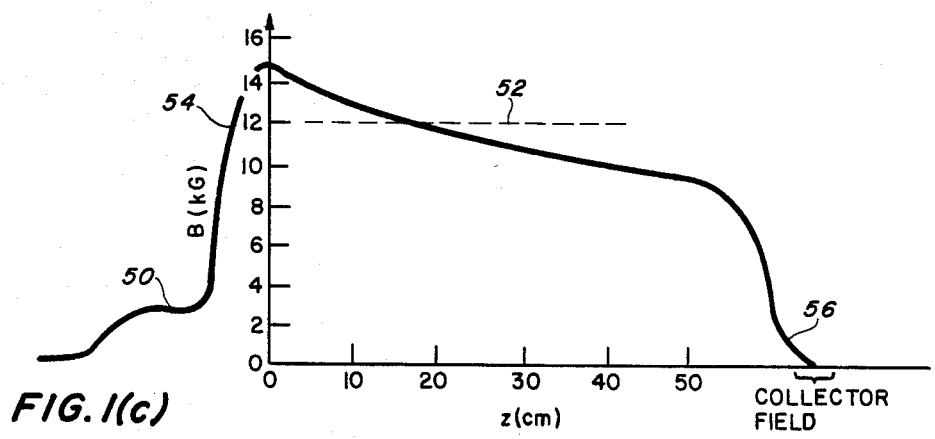
FIG. 1(c) is a graph of the magnetic field profile (kilogauss) along the length (cm) of the tapered waveguide of FIG. 1(c).
Figure 8:
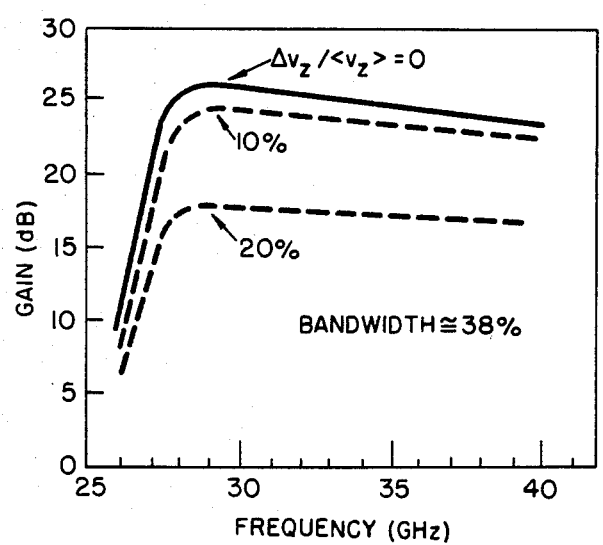
FIG. 8 is a graph of the theoretical gain (dB) of the device of FIG. 1 over a given bandwidth for three different electron velocity spreads.

Using the configuration shown in FIG. 1(a), with a $TE_{11}°$ mode, a 38% bandwidth is predicted with a gain of 20 dB. FIG. 8 is a graph illustrating the predicted gain response for the configuration of FIG. 1(a) for three different velocity spreads. In the figure, $66 v_z$ is the standard deviation and $<v_z>$ is the mean, and $\Delta v_z/<v_z>$ represents the axial velocity spread of the electron beam.

Although the taper of the waveguide was linear in the experiment, there is certainly no restriction to such a linear taper. The function of the waveguide radius in terms of the waveguide axial length z, $r_w(z)$, can be determined, way of example, using a requirement that the total gain G has a uniform value for all frequencies. It is noted that the actual gain for a fixed frequency tapers off on both sides of its peak. Assuming the interaction region for a fixed frequency extends from $z_1$ to $z_2$, the total gain is then given in terms of the local gain per unit length $g(z,\omega)$ by the equation $$G(w) = \int_{z_1}^{z_2} g(z,w)dz \quad (8)$$

where g(z,w) is the local gain for a given frequency as evaluated from a dispersion relation as described in the paper "Theory and Simulation of the Gyrotron Traveling Wave Amplifier Operating at Cyclotron Harmonics" by K. R. Chu, A. J. Drobot, H. H. Szu, and P. Sprangle, IEEE Trans. Microwave Theory Tech., Vol. MTT-28, pp. 313-317, April 1980. Accordingly, given a desired total gain, it is possible to determine the waveguide profile $r_w(z)$ from equation (8). In addition, though operating at the fundamental is stressed here, operation at cyclotron harmonics can also be implemented as illustrated in the referenced wideband theory paper by Chu, et al.

Thus, the distributed nature of the amplification processes and the flexibility to shape the waveguide profile, make it possible to design an amplifier with uniform total small signal gain across the entire frequency band.

The beam-wave interaction in the present device is the result of the electron cyclotron maser instability. The main element in the present broad-banding scheme is that different portions of the waveguide amplify different frequencies. Thus, as the TE$_{mn}$ wave of a given frequency is launched into the waveguides structure, it will be amplified in a particular interaction section of the waveguide, where its cutoff frequency closely matches the wave frequency. This broad banding type operation is made possible by the use of a tapered waveguide in combination with the specifically profiled magnetic field disclosed herein. In essence, this profile magnetic field maintains the cutoff frequency nearly equal to the electron cyclotron frequency throughout the waveguide. In contrast to the bandwidth of conventional gyrotron-TWA, which offer a bandwidth of at most a few percent, the bandwidth of the present device is greatly increased, as this later quantity is proportional to the radius differential of the waveguide, which can be arbitrary. Typically octave-like saturated bandwidth appears to be possible with a saturated bandwidth greater than two octaves calculated for the TE$_{01}°$ and the TE$_{11}°$ modes.

It has been determined experimentally that with the use of the present reverse injection method in combination with the precise magnetic field profile set forth, there is an absence of launching loss. This absence of launching loss contributes (along with a small prebunching gain) to an additional 9 to 11 dB gain over that which would be obtained from a more conventional transmission type amplifier. A theoretical study of this phenomena has been done in the paper "Gyrotron Traveling Wave Amplifier: IV. Analysis of Launching Loss" by Y. Y. Lau, L. R. Barnett, and V. L. Granatstein, Int. J. Infared Millimeter Waves, 1981.

It should be noted, that the total linear gain of the device can be made essentially independent of frequency by choosing optimized axial contours of the wall radius in conjunction with the presently disclosed magnetic field profile.

Although the present device has ben disclosed in the context of use with TE$_{o1}°$ and TE$_{11}°$ energy modes, it should be understood that it is capable of use with a wide variety of waveguide energy modes and cyclotron harmonics.

It should further be noted that since this device is always operating at the "grazing condition" near the cutoff frequency of the waveguide, its performance is not seriously degraded by velocity spread even in the high frequency regime. This is a significant advantage over the cyclotron slow wave amplifier. It should also be noted that the difficulty with dielectric breakdown and poor heat dissipation is avoided all together since no dielectric lining is necessary for this device.

In essence, the present gyrotron traveling-wave amplifier is capable of amplifying at high power over very wideband widths. It is simple in construction and inexpensive in manufacture due to the lack of a need for slow wave structure or a dielectric lining. It is projected to have significant use in radar and in communications systems due to its high power handling capability at millimeter and submillimeter wavelengths.

As a final note, it should be understood that although the present reverse injection in combination with a precise magnetic field profile is most advantageously used in the context of a fast wave device, it may also be utilized with slow-wave gyrotron amplifiers with either dielectric or periodic circuit loading and also with conventional electron beam amplifiers.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A wide-band gyrotron traveling wave amplifier comprising:
   a tapered waveguide wherein the cross-section thereof gradually increases from a small first end thereof to a larger second end for propagating electromagnetic energy therein;
   means for generating a beam of relativistic electrons with helical electron motion, and applying this beam to said small first end of said tapered waveguide to propagate in the axial direction therein;
   means for generating a tapered magnetic field B within said waveguide in a direction approximately parallel to the axis of said waveguide with a profile closely in accordance with the following equation:

$$\frac{B}{B_o} = \frac{\gamma_{zo}\beta_{\perp o}^2\lambda_{wo}^2}{2\lambda_w^2}\left[1 + \left(1 + \frac{4\lambda_w^2}{\gamma^2\gamma_{zo}^2\beta_{\perp o}^4\lambda_{wo}^2}\right)^{\frac{1}{2}}\right]$$

where
B$_o$ is the axial magnetic field at the small first end,
$\gamma = (1 - V_\perp^2/C^2 - V_z^2/C^2)^{-\frac{1}{2}}$
$\gamma_{zo} = (1 - V_{\perp o}^2/C^2 - V_{zo}^2/C^2)^{-\frac{1}{2}}$
$\beta_{\perp o}$ is the electron velocity perpendicular to the magnetic field at the small first end of the waveguide divided by c,
$\lambda_w$ is the cutoff wavelength of said tapered waveguide,
$\lambda_{wo}$ is the cutoff wavelength of said tapered waveguide at the small first end thereof,
V$_\perp$ is the electron velocity perpendicular to the waveguide axis,
V$_{\perp o}$ is the electron velocity perpendicular to the waveguide axis at the small first end of said waveguide;
V$_z$ is the electron velocity parallel to the waveguide axis,
V$_{zo}$ is the electron velocity parallel to the waveguide axis at the small first end of said waveguide; and
   means for launching an input electromagnetic wave at said larger second end of said waveguide to propagate toward said small first end such that the frequencies in the input wave will be reflected at various points along the constriction of said tapered waveguide so that they copropagate with said electron beam and are amplified thereby.

2. A wide-band gyrotron traveling wave amplifier as defined in claim 1, wherein said tapered waveguide is circular in cross-section with the radius r$_w$ of the circular tapered waveguide being proportional to $\lambda_w$ and with the radius $r_{wo}$ of the circular tapered waveguide at the small first end thereof being proportional to $\lambda_{wo}$.

3. A wide-band gyrotron traveling wave amplifier as defined in claims 1 or 2, wherein said tapered magnetic field generating means comprises:
- a first magnetic coil system for generating a constant magnetic field axially within said tapered waveguide, and
- a second magnetic system comprising a plurality of small solenoids for adding the desired taper profile to the axial magnetic field within said tapered waveguide.

4. A wide-band gyrotron traveling wave amplifier as defined in claim 3, wherein each of said small solenoids in said second magnetic system includes a separate power supply therefor.

5. A wide-band gyrotron traveling wave amplifier as defined in claim 3, wherein said electron beam generating means comprises a magnetron-type injection gun.

* * * * *